US008780516B2

(12) United States Patent
Wagoner et al.

(10) Patent No.: US 8,780,516 B2
(45) Date of Patent: Jul. 15, 2014

(54) SYSTEMS, METHODS, AND APPARATUS FOR VOLTAGE CLAMP CIRCUITS

(75) Inventors: Robert Gregory Wagoner, Roanoke, VA (US); Geng Tian, Roanoke, VA (US)

(73) Assignee: General Electric Conpany, Schenectady, NY (US)

( * ) Notice: Subject to any disclaimer, the term of this patent is extended or adjusted under 35 U.S.C. 154(b) by 63 days.

(21) Appl. No.: 13/466,627

(22) Filed: May 8, 2012

(65) Prior Publication Data

US 2013/0301170 A1 Nov. 14, 2013

(51) Int. Cl.
*H02H 3/20* (2006.01)
*H02H 9/04* (2006.01)
*H02H 3/22* (2006.01)
*H02H 9/00* (2006.01)

(52) U.S. Cl.
USPC .............. 361/91.1; 361/56; 361/111

(58) Field of Classification Search
USPC .......................... 361/91.1, 56, 111
See application file for complete search history.

(56) References Cited

U.S. PATENT DOCUMENTS 6,531,908 B1  3/2003  Goeser et al.

*Primary Examiner* — Rexford Barnie
*Assistant Examiner* — Christopher Clark
(74) *Attorney, Agent, or Firm* — Sutherland Asbill & Brennan LLP

(57) ABSTRACT

Certain embodiments of the invention may include systems, methods and apparatus for voltage clamp circuits. According to an example embodiment of the invention, a voltage clamp circuit may include a first circuit portion electrically coupled to the output of at least one power source. The first circuit portion comprises a power semiconductor device having a first, second and a third node and one or more zener diodes electrically coupled to the first or the second node of the power semiconductor device. The voltage clamp circuit may further include a second circuit portion in electrical communication with the first circuit portion, where the second circuit portion comprises a resistor, a capacitor and a directional device, and where the second circuit portion connects to the one or more zener diodes to reduce peak voltage output between the second and the third node of the power semiconductor device.

14 Claims, 12 Drawing Sheets

SYSTEMS, METHODS, AND APPARATUS FOR VOLTAGE CLAMP CIRCUITS

FIELD OF THE INVENTION

This invention generally relates to power converters, and more particularly to systems, methods, and apparatus for providing voltage clamp circuits.

BACKGROUND

Power semiconductor devices, such as, insulated gate bipolar transistors (IGBTs) are used in a variety of applications that require high frequency switching of electrical power. For instance, IGBTs may be used to generate pulse-width modulation (PWM) signals for industrial and traction applications. In such applications, the IGBTs are turned on and off at a high frequency. During operation, when inductive loads are switched off, the IGBTs become non-conducting, and a transition to a high voltage state is executed in a very short period of time.

For instance, when a control signal is fed to the gate (G) of the IGBT, the IGBT may be turned on and the voltage between the collector (C) and the emitter (E) of the IGBT is approximately zero volts. During this period of time load current will flow between the collector (C) and the emitter (E) of the IGBT. When the control signal is switched off, the IGBT may become non-conducting between the collector C and the emitter E, and the voltage between the collector C and the emitter E of the IGBT rapidly increases at the initial period of the switch off period. As a result of the inductance in the wiring to the IGBT terminals, a voltage spike may occur, which can, in certain cases, result in damage to the IGBT and a power loss imbalance. To reduce the overvoltage of the IGBT during the turn off period, a voltage clamp circuit was developed.

As shown in FIG. 2, a conventional voltage clamp circuit 110 may include at least one resistor $R_G$ and one or more zener diodes, $ZD_1$, $ZD_2$. The zener diodes, $ZD_1$, $ZD_2$, may be connected in series between the collector C and the gate G of the IGBT $Q_1$, and the at least one resistor $R_G$ may be connected to the gate G of the IGBT $Q_1$. During operation, when the voltage output between the collector C and the emitter E of the IGBT $Q_1$ reaches the zener voltage, a current flows to the gate G and turns on the IGBT $Q_1$ in order to limit the output voltage of the IGBT $Q_1$ to the value of the zener voltage.

While the prior art voltage clamp circuit 110 of FIG. 2 limits the output voltage of the IGBT, the zener protection is known to retard the time profile of the high voltage transition during the switching off period due to a time delay, due to parasitic inductances and capacitances in the wiring loop comprising the components in the conventional voltage clamp circuit. As shown in FIG. 3, when the load is switched off, at time 122, the voltage output $V_{CE}$ between the collector C and the emitter E of the IGBT increases rapidly and may overshoot above the zener voltage. Thereafter, the cut-in of limiting the output voltage $V_{CE}$ to the zener voltage is time delayed as represented at time point 120. This may result in a voltage overshoot of the IGBT at the start of the turn off cycle, which may cause damage to the IGBT.

BRIEF SUMMARY

Some or all of the needs may be addressed by certain embodiments of the disclosure. Certain embodiments of the disclosure may include systems, methods, and apparatus for voltage clamp circuits. In one embodiment, a voltage clamp circuit may include a first circuit portion electrically coupled to the output of at least one power source. The first circuit portion comprises a power semiconductor device having a first, second and third node and one or more zener diodes electrically coupled to the first or the second node of the power semiconductor device. The voltage clamp circuit may further include a second circuit portion in electrical communication with the first circuit portion, where the second circuit portion comprises a resistor, a capacitor and a directional device, and where the second circuit portion connects to the one or more zener diodes to reduce peak voltage output between the second and the third node of the power semiconductor device.

In another embodiment, a method may be provided. The method may include providing at least one power semiconductor device having a first node, a second node and a third node. The method may further include providing at least one directional electrical element between the first node and the second node of the at least one power semiconductor device. The method may also include providing a circuit segment comprising at least one resistor and a capacitor, where the circuit segment is associated with the at least one directional electrical element. Further, the method may include selectively providing power to the at least one power semiconductor device to reduce peak voltage output between the second node and the third node of the at least one power semiconductor device.

In yet another embodiment, an alternative energy power system may be provided. The alternative energy power system may provide electrical power at an output voltage. The alternative energy power system may include a first circuit portion electrically connected to the output of at least one power source, where the first circuit portion comprises a power semiconductor device having a first, second and third node and one or more zener diodes. The alternative energy power system may further include a second circuit portion comprising a resistor, a capacitor and a directional device, where the second circuit portion is electrically connected to at least one of the zener diodes of the first circuit portion in order to reduce peak voltage output between the second and third nodes of the power semiconductor device.

Other embodiments, features, and aspects of the disclosure are described in detail herein and are considered a part of the claims. Other embodiments, features, and aspects can be understood with reference to the following detailed description, accompanying drawings, and claims.

BRIEF DESCRIPTION OF THE FIGURES

Reference will now be made to the accompanying drawings, which are not necessarily drawn to scale, and wherein.

DETAILED DESCRIPTION OF AN EMBODIMENT

Embodiments of the disclosure are described more fully hereinafter with reference to the accompanying drawings, in which embodiments of the disclosure are shown. This disclosure may, however, be embodied in many different forms and should not be construed as limited to the embodiments set forth herein; rather, these embodiments are provided so that this disclosure will be thorough and complete, and will fully convey the scope of the disclosure to those skilled in the art. Like numbers and combinations of letters and numbers refer to like elements throughout.

Embodiments of the disclosure may provide systems, methods, and apparatus for an alternative energy power converter system. Such improvements may entail, for example, allowing a power semiconductor device to operate with a higher output power for a converter, at a higher switching frequency, or at a lower temperature. Such improvements may be implemented by incorporating one or more resistors, a capacitor and a directional device to a voltage clamp circuit. In applications when inductive loads are switched, certain improvements may be utilized to limit high switch-off voltage in order to reduce, for example, IGBT overvoltage. As such, power semiconductor devices and voltage clamp circuits, as described herein with respect to certain embodiments of the invention, may be used in alternative energy systems such as, for instance, systems used for delivering power from solar, wind and thermal energy sources. One technical effect of certain embodiments of systems and processes incorporating these improvements may be various environmental benefits such as, for instance, reducing the interference from radiation emissions associated with switched power output.

Example embodiments of the disclosure will now be described with reference to the accompanying figures.

Figure 1:
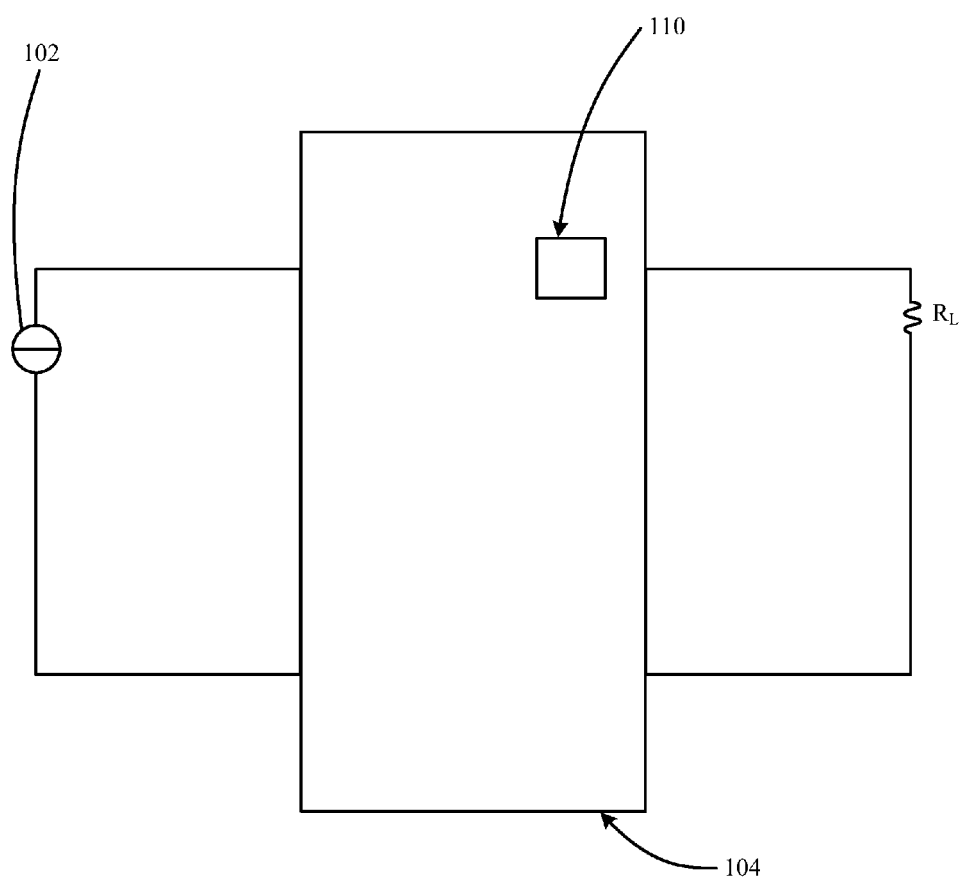
FIG. 1 is a schematic view of an alternative energy power converter system according to an embodiment of the disclosure.

Referring now to FIG. 1, an alternative energy power converter system 100 according to an embodiment of the disclosure is shown. The alternative energy power converter system 100 may include a semiconductor device 104 such as, for example, an IGBT. The semiconductor device 104 may receive power from a power source 102 such as, for instance, a power converter. The alternative energy power converter system 100 may also include at least one load resistor $R_L$. The alternative energy power converter system 100 may also include a voltage clamp circuit 110 for protecting the semiconductor device 104 against voltage spikes in the power received from the power source 102.

While the power semiconductor device 104 described herein is shown as an IGBT, it will be appreciated that the power semiconductor device 104 may be any suitable device including, but not limited to, a metal oxide semiconductor field effect transistor (MOSFET), a bipolar junction transistor, a pseudomorphic high electron mobility transistor (pHEMT), a heterojunction bipolar transistor (HBT), or combinations thereof. It will also be appreciated that while the voltage clamp circuits are described herein in the context of power systems and power converters, voltage clamp circuits may be applied to any variety of applications.

Figure 2:
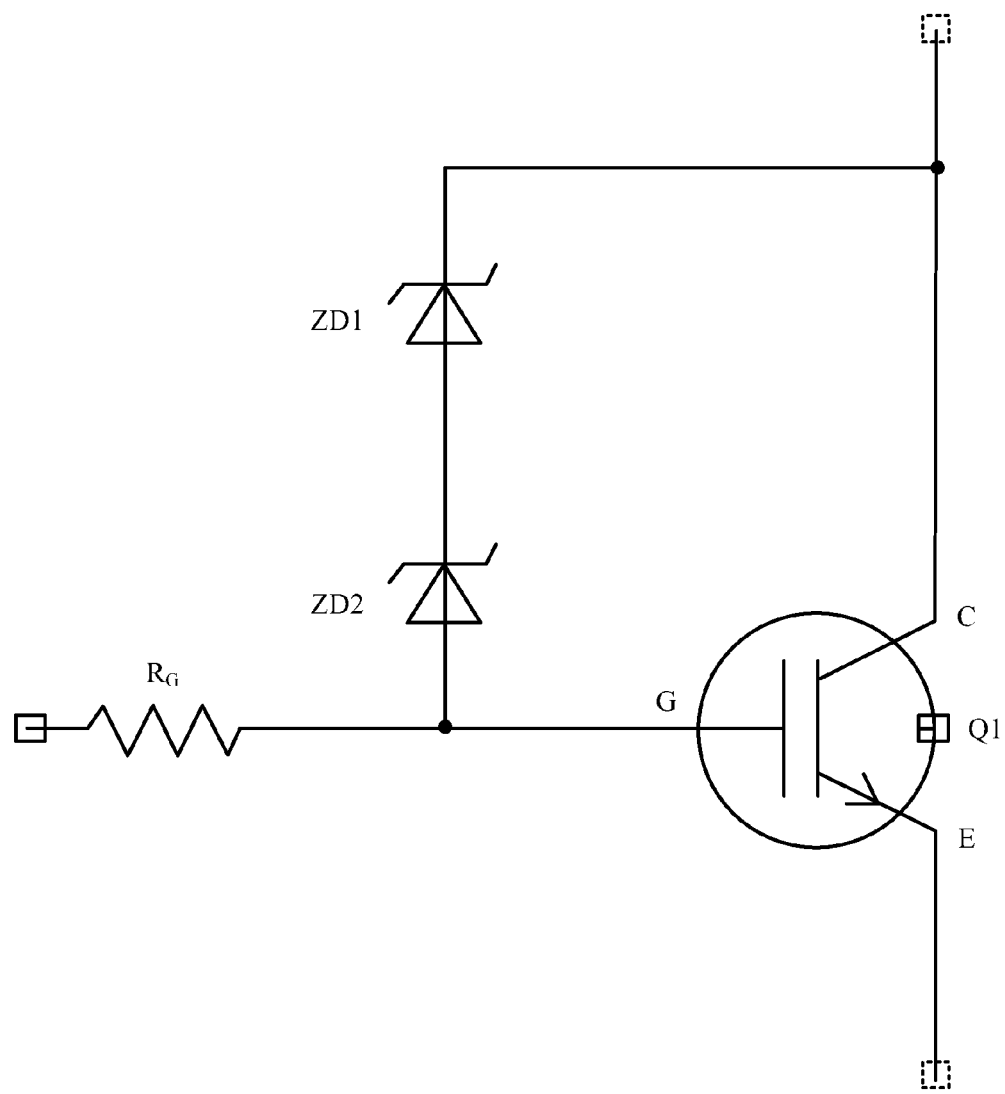
FIG. 2 is a schematic view of a conventional voltage clamp circuit.
Figure 3:
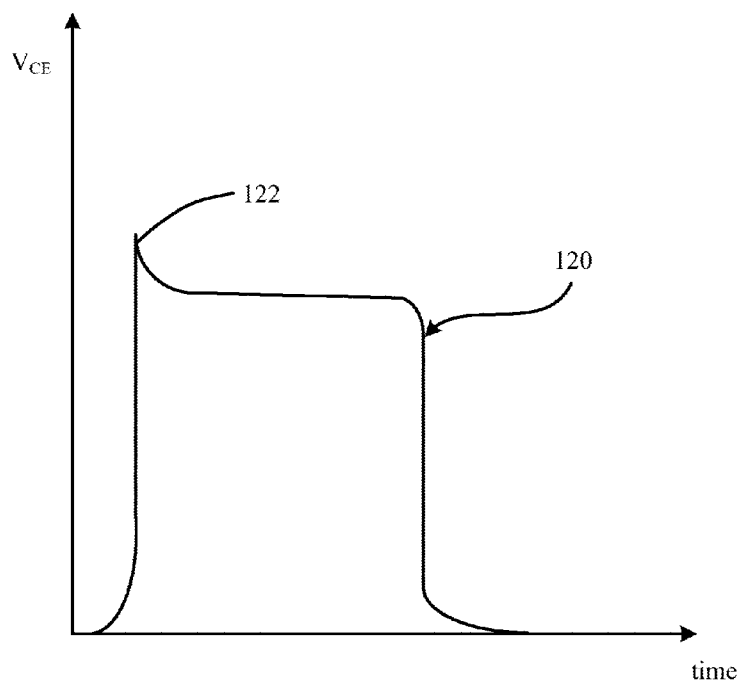
FIG. 3 is a graphical view of an operation of the conventional voltage clamp circuit shown in FIG. 2.
Figure 4:
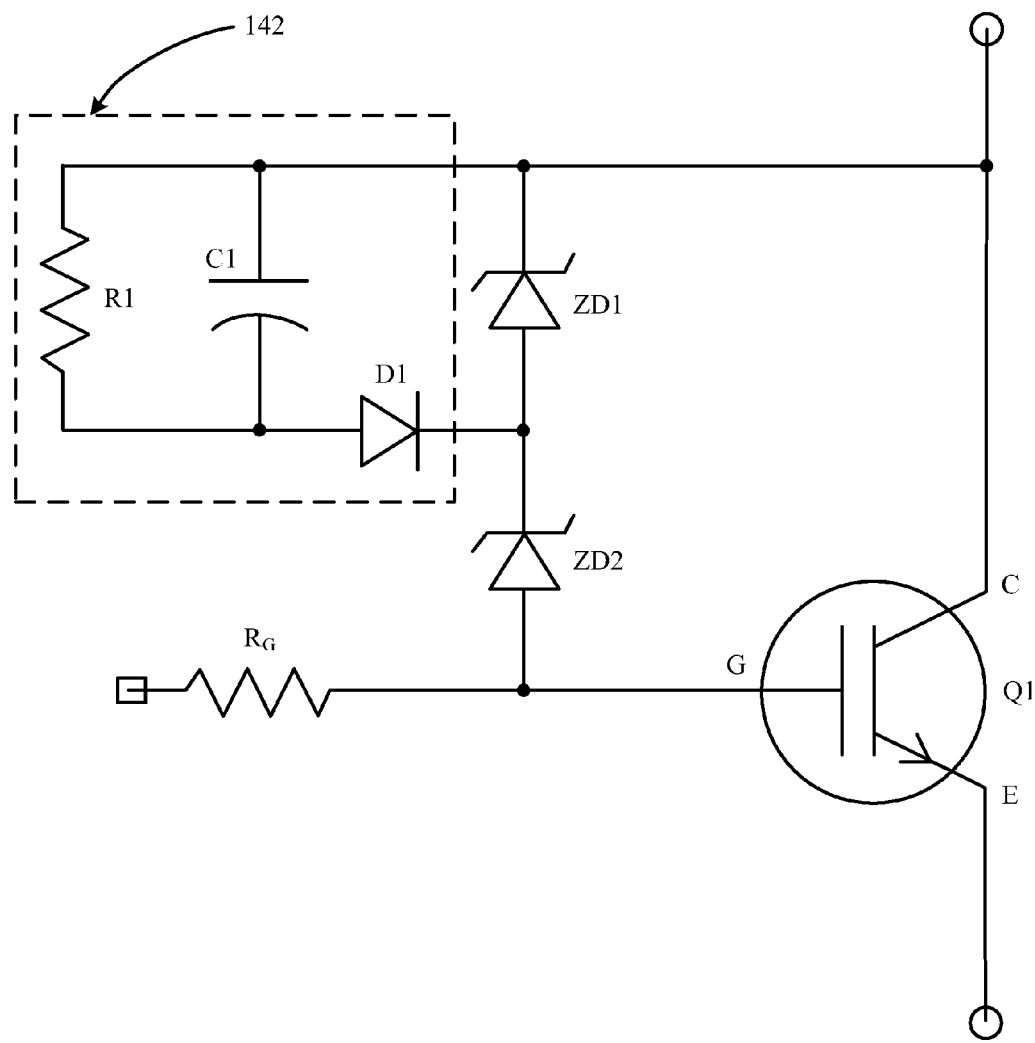
FIG. 4 is an example circuit schematic of a voltage clamp circuit according to an embodiment of the disclosure.

Continuing on to FIG. 4, the voltage clamp circuit 140 may include the circuit of FIG. 2, referred to as a first circuit portion, electrically coupled to a second circuit portion 142. As discussed above, the first circuit portion of FIG. 2 may include an IGBT $Q_1$ and two zener diodes, $ZD_1$, $ZD_2$, electrically connected to the gate G and the collector C of the IGBT $Q_1$. The second circuit portion 142 may include a first resistor $R_1$ and a capacitor $C_1$ in parallel with each other. The second circuit portion 142 may further include at least one directional device $D_1$, such as, for example, a diode, where the first resistor $R_1$ and the capacitor $C_1$ are in series with the directional device $D_1$.

The second circuit portion 142 of FIG. 4 may be electrically connected to one or more of the zener diodes $ZD_1$, $ZD_2$. The result of connecting the second circuit portion 142 to one or more of the zener diodes $ZD_1$, $ZD_2$, is to limit the output voltage between the collector C and the emitter E of the IGBT $Q_1$ at the start of the turn off cycle. To this end, limiting the output voltage of the IGBT $Q_1$ to the zener voltage may take place with relatively limited voltage overshoot, resulting in relatively less electromagnetic radiation interference than with the prior art circuit of FIG. 2.

Figure 5:
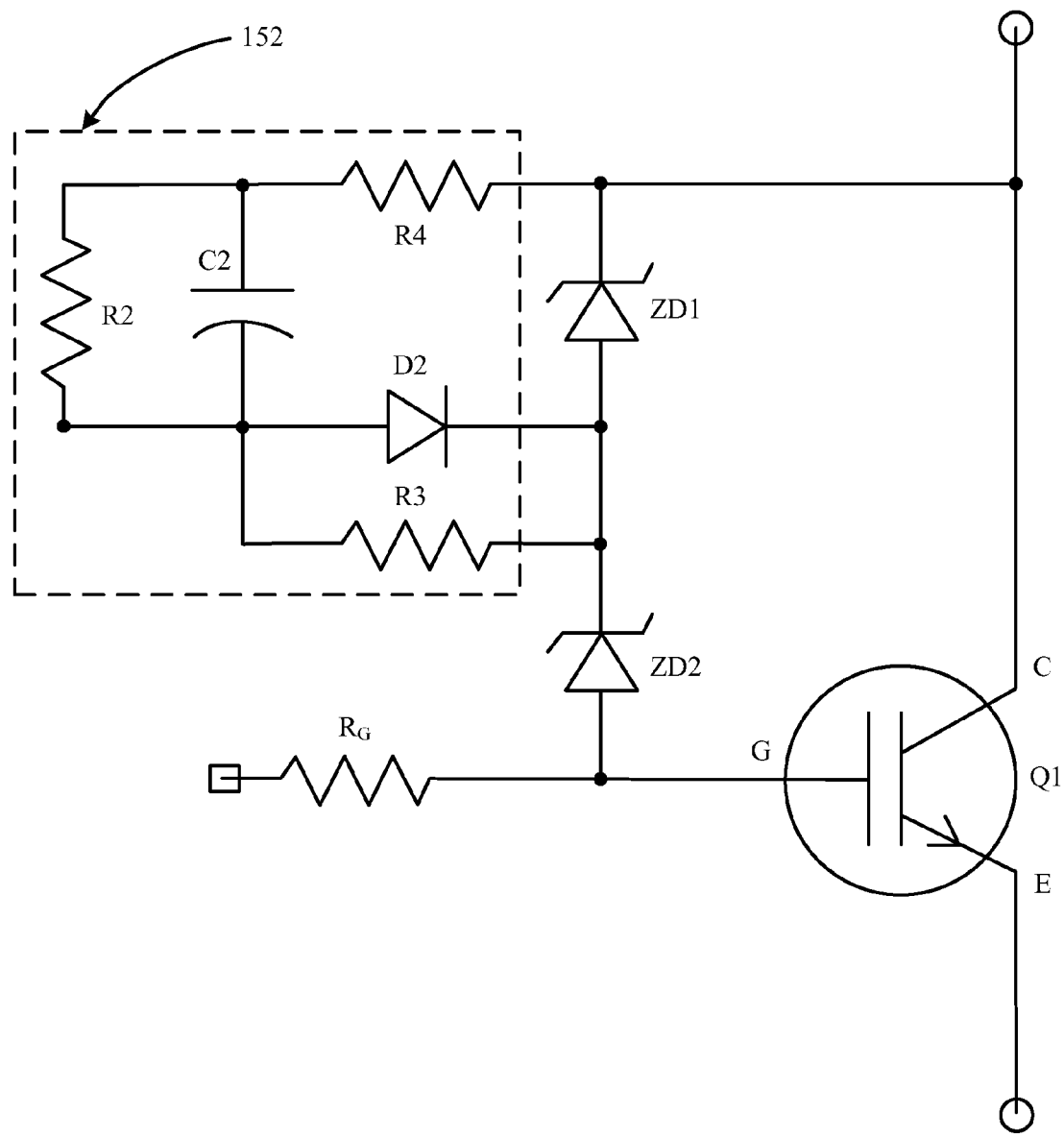
FIGS. 5-11 are additional example circuit schematics of voltage clamp circuits according to other embodiments of the disclosure.

Referring now to FIG. 5, shown is another example circuit diagram of a voltage clamp circuit 150. The voltage clamp circuit 150 may include the circuit of FIG. 2, referred to as a first circuit portion, electrically coupled to a second circuit portion 152. The second circuit portion 152 may comprise a first resistor $R_2$ and a capacitor $C_2$ in parallel with each other. The second circuit portion 152 may further include at least one directional device $D_2$, such as, for example, a diode, where the first resistor $R_2$ and the capacitor $C_2$ are in series with the directional device $D_2$. The second circuit portion 152 may further comprise a second resistor $R_3$ and a third resistor $R_4$ in parallel with the directional device $D_2$.

Figure 6:
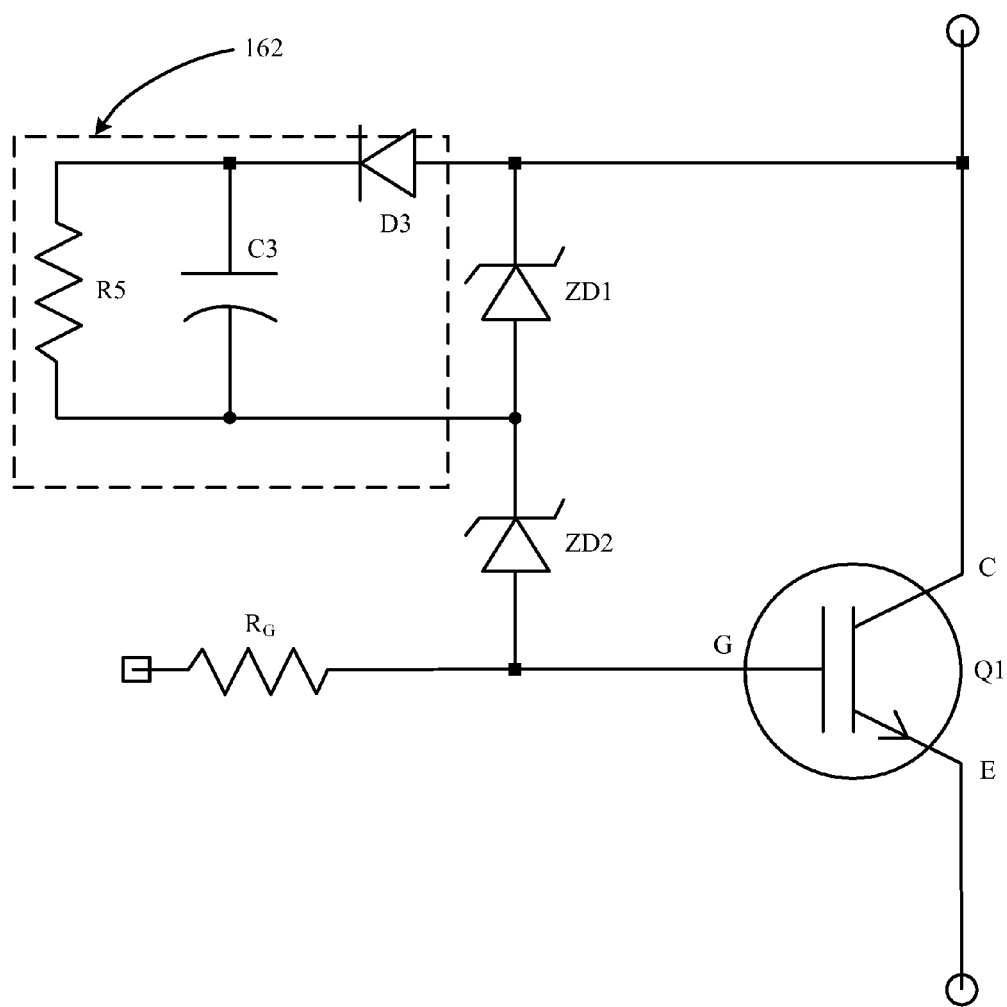

Referring now to FIG. 6, shown is another example circuit diagram of a voltage clamp circuit 160. The voltage clamp circuit 160 may include the circuit of FIG. 2, referred to as a first circuit portion, electrically coupled to a second circuit portion 162. The second circuit portion 162 may comprise a resistor $R_5$ and a capacitor $C_3$ in parallel with each other. The second circuit portion 162 may further include at least one directional device $D_3$ such as, for example, a diode, where the resistor $R_5$ and the capacitor $C_3$ are in series with the directional device $D_3$, and where the directional device $D_3$ may be electrically connected to the collector C of the IGBT $Q_1$.

Figure 7:
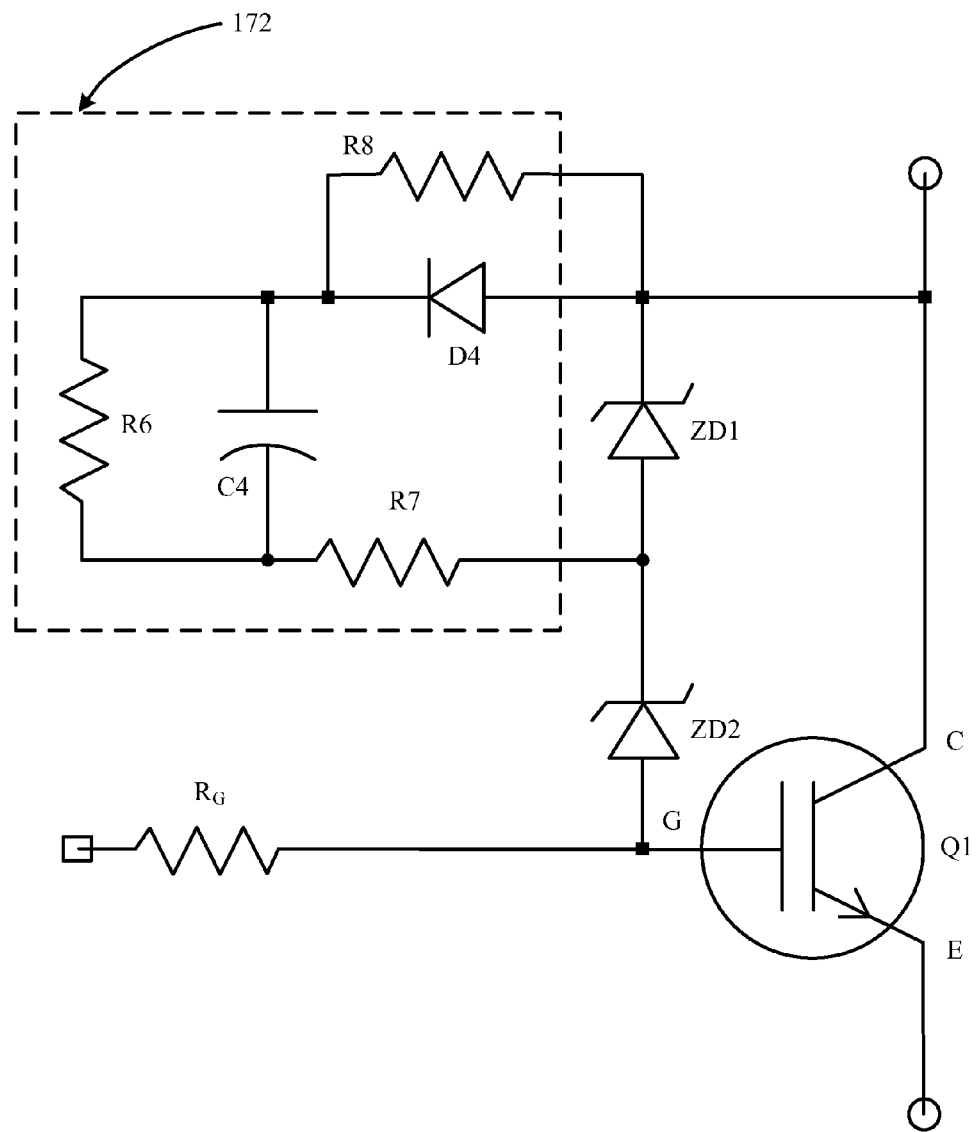

Moving on to FIG. 7, shown is another example circuit diagram of a voltage clamp circuit 170 comprising a second circuit portion 172 according to another embodiment. The voltage clamp circuit 170 may include the circuit of FIG. 2, referred to as a first circuit portion, electrically coupled to a second circuit portion 172. The second circuit portion 172 may comprise a first resistor $R_6$ and a capacitor $C_4$ in parallel with each other. The second circuit portion 172 may further include at least one directional device $D_4$, such as, for example, a diode, where the first resistor $R_6$ and the capacitor $C_4$ are in series with the directional device $D_4$, and where the directional device $D_4$ may be electrically connected to the collector C of the IGBT $Q_1$. The second circuit portion 172 of the voltage clamp circuit 170 may further comprise a second resistor $R_7$ and a third resistor $R_8$ in parallel with the directional device $D_4$.

Figure 8:
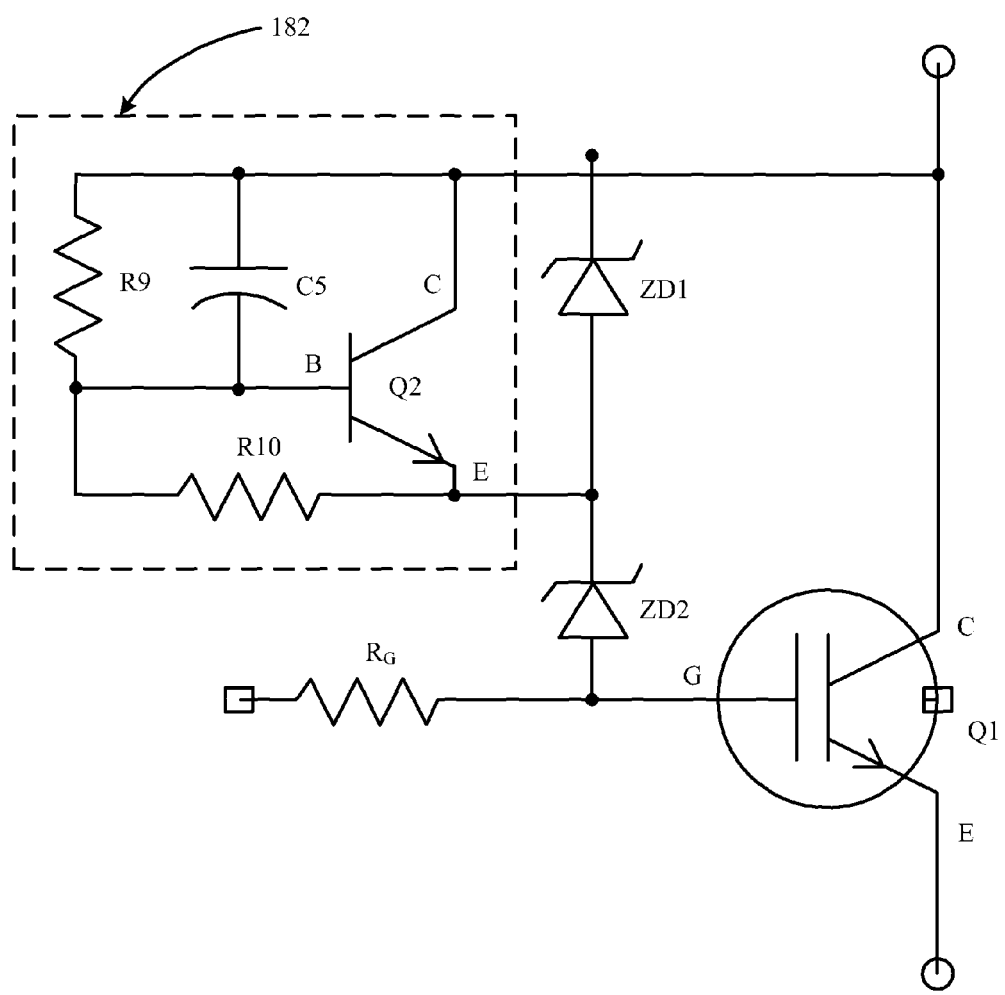

Referring now to FIG. 8, shown is another example circuit diagram of a voltage clamp circuit 180 comprising a second circuit portion 182 according to another embodiment. The voltage clamp circuit 180 may include the circuit of FIG. 2, referred to as a first circuit portion, electrically coupled to a second circuit portion 182. The second circuit portion 182 may include a first resistor $R_9$, a second resistor $R_{10}$, a capacitor $C_5$ and a bipolar junction transistor (BJT) $Q_2$, where the first resistor $R_9$ is electrically coupled to the base B of the BJT $Q_2$. In this case, the BJT $Q_2$ may be a NPN BJT.

Figure 9:
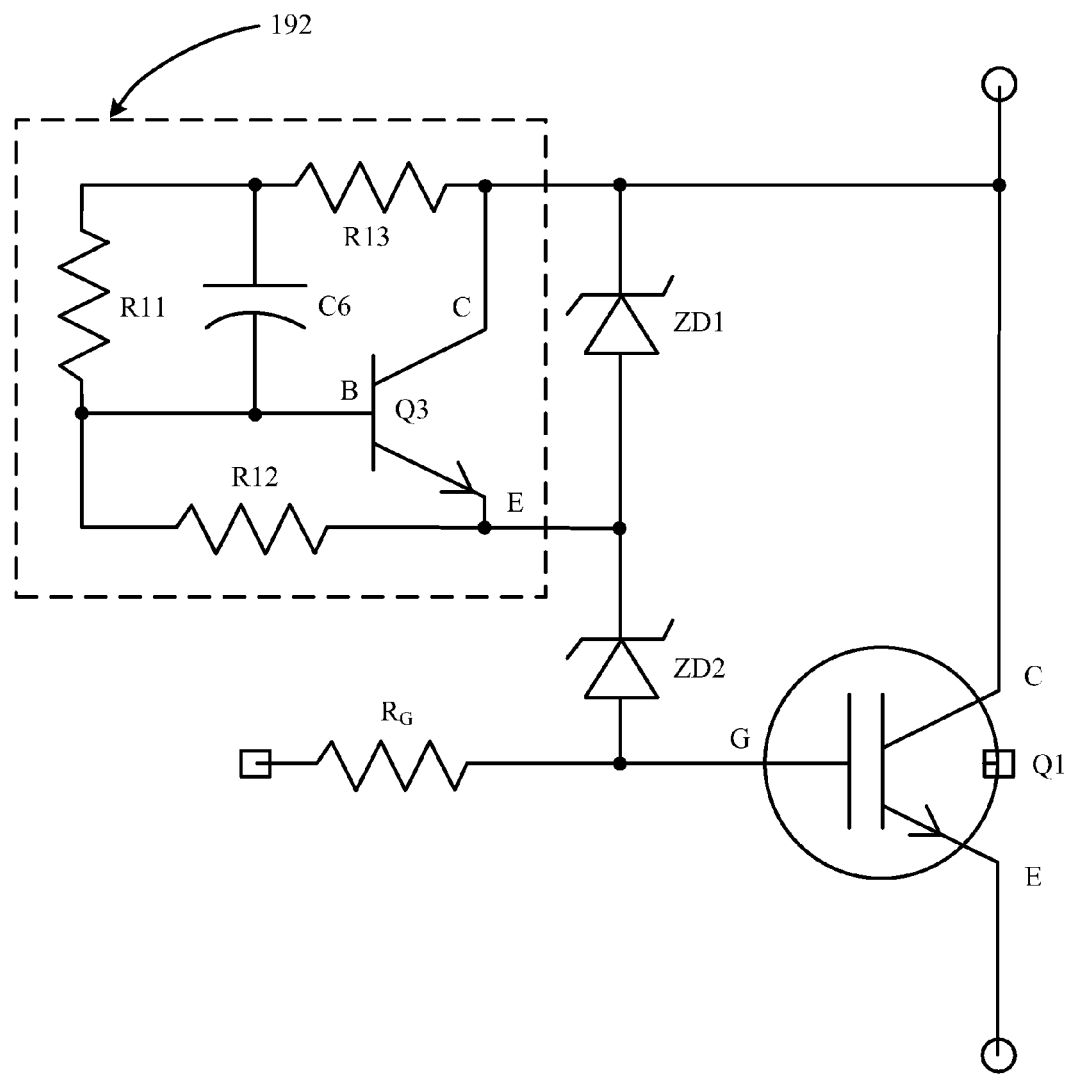

Additionally, in FIG. 9, shown is another example circuit diagram of a voltage clamp circuit 190 comprising a second circuit portion 192 according to another embodiment. The voltage clamp circuit 190 may include the circuit of FIG. 2, referred to as a first circuit portion, electrically coupled to a second circuit portion 192. The second circuit portion 192 may include a first resistor $R_{11}$, a second resistor $R_{12}$, a capacitor $C_6$ and a BJT $Q_3$, where the first resistor $R_{11}$ is electrically coupled to the base B of the BJT $Q_3$. In this case, the BJT $Q_3$ may be a NPN BJT. The second circuit portion 192 may further comprise a third resistor $R_{13}$, where the third resistor $R_{13}$ is in series with the first resistor $R_{11}$, the capacitor $C_6$ and the BJT $Q_3$.

Figure 10:
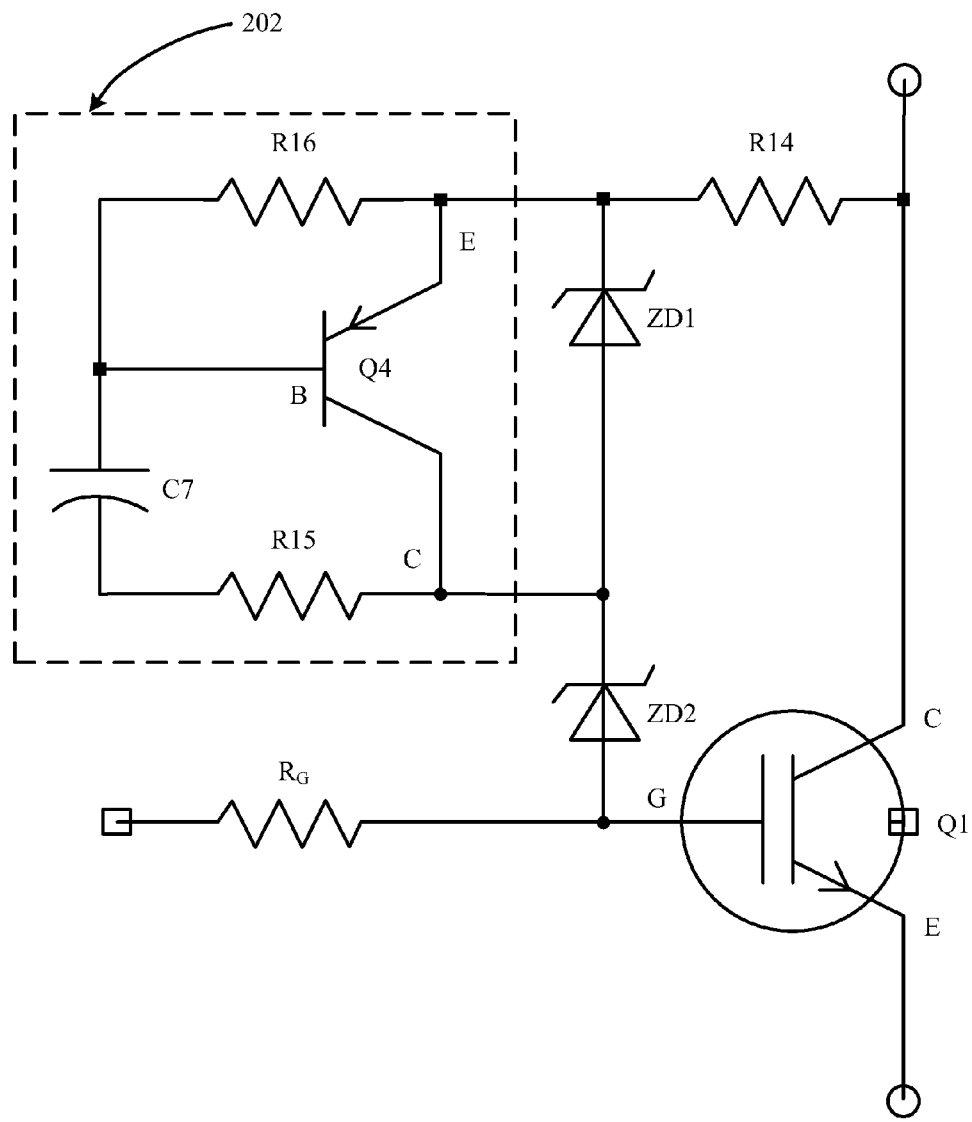

Referring now to FIG. 10, shown is another example circuit diagram of a voltage clamp circuit 200 comprising a second circuit portion 202 according to another embodiment. The voltage clamp circuit 200 may include the circuit of FIG. 2, referred to as a first circuit portion electrically coupled to a second circuit portion 202. The first circuit portion may further include a second resistor $R_{14}$, where at least one of the zener diodes $ZD_1$, $ZD_2$ is electrically connected to the gate G of the IGBT $Q_1$. The second circuit portion 202 may comprise a third resistor $R_{15}$, a fourth resistor $R_{16}$, a capacitor $C_7$ and a bipolar PNP transistor $Q_4$, where the capacitor $C_7$ may be electrically connected to the base B of the bipolar PNP transistor $Q_4$.

Figure 11:
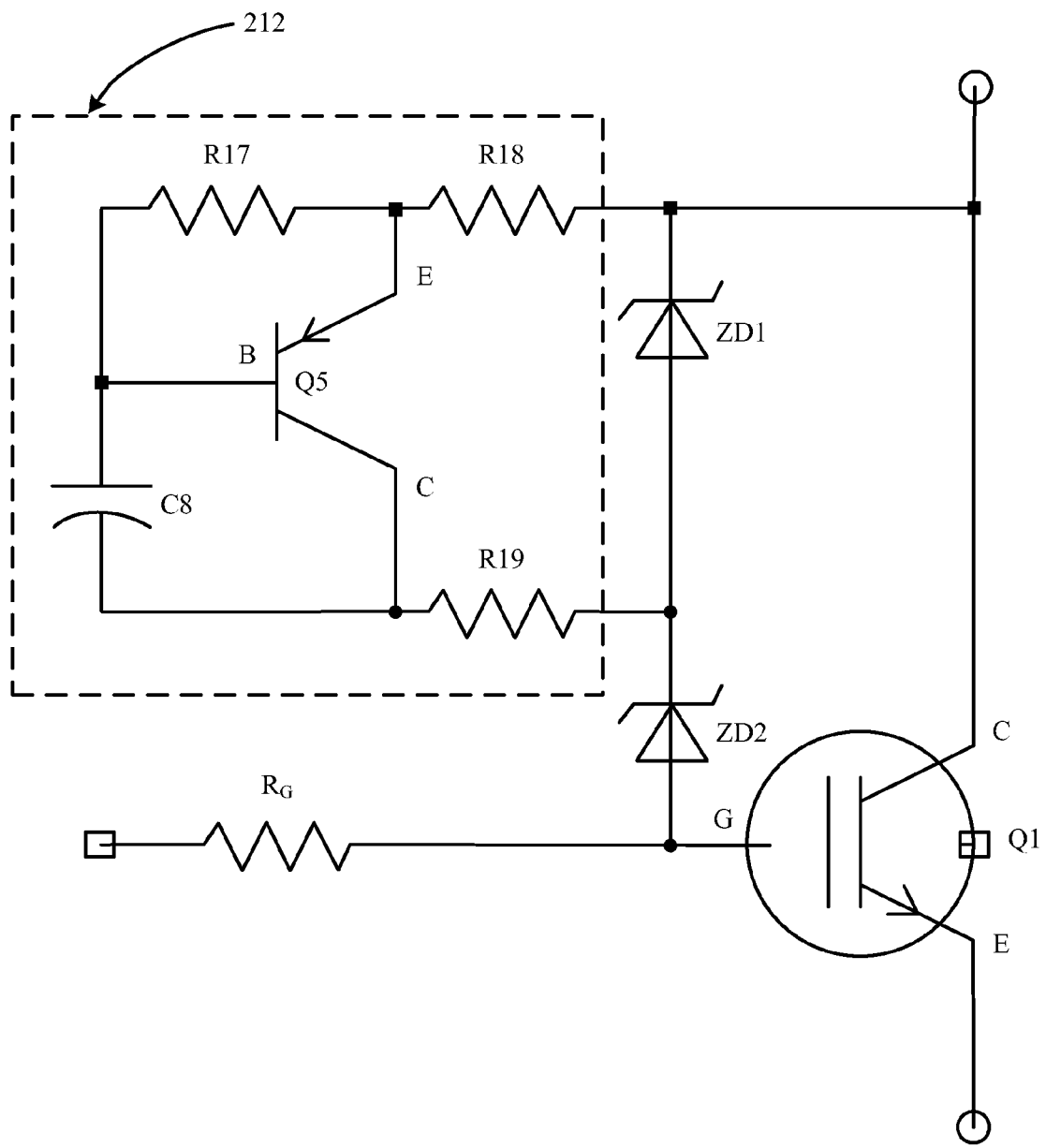

Referring now to FIG. 11, shown is another example circuit diagram of a voltage clamp circuit 210 comprising a second circuit portion 212 according to another embodiment. The voltage clamp circuit 210 may include the circuit of FIG. 2, referred to as a first circuit portion electrically coupled to a second circuit portion 212. The second circuit portion 212 may comprise a first resistor $R_{17}$, and a capacitor $C_8$ in parallel with each other. The second circuit portion 212 may further comprise a second resistor $R_{18}$, a third resistor $R_{19}$ and a bipolar PNP transistor $Q_5$, where the capacitor $C_8$ is electrically connected to the base B of the bipolar PNP transistor $Q_5$.

Figure 12:
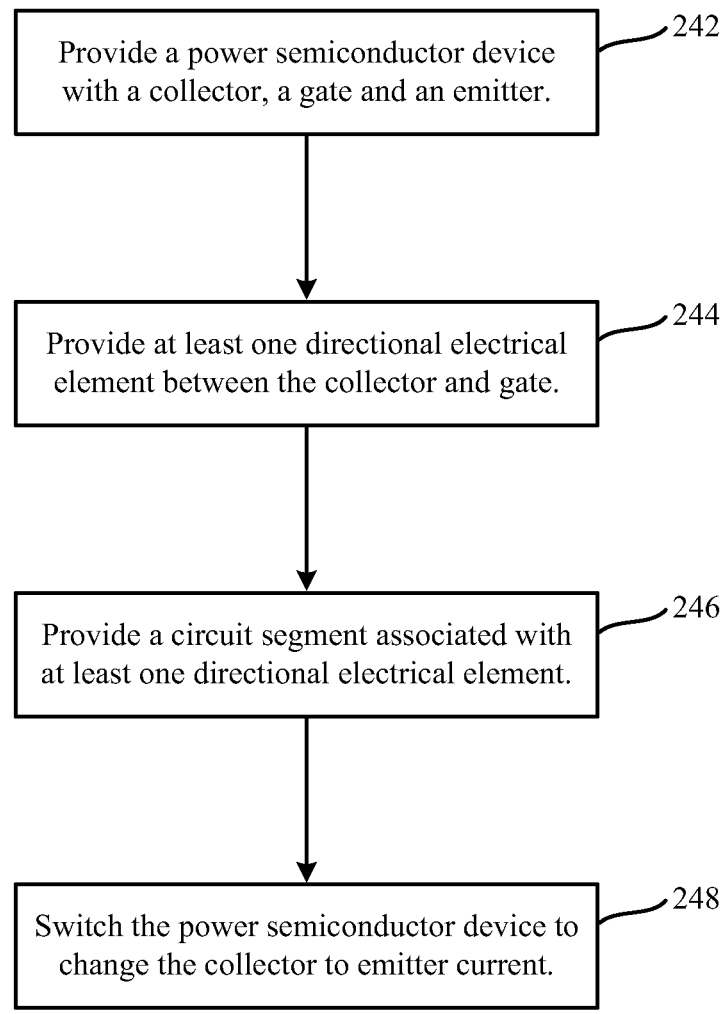
FIG. 12 is a flow diagram of an example method to reduce high switch-off voltage according to an embodiment of the disclosure.

Referring now to FIG. 12, an example method 240 of reducing the peak voltage between a second node and a third node of a power semiconductor device is depicted. The method 240 may be implemented using the circuits, apparatus, signals, and systems as disclosed in reference to FIGS. 1 through 11. At block 242, a power semiconductor device having a collector, a gate and an emitter is provided. As shown in FIGS. 4 through 11, the power semiconductor device may, in one aspect, be an IGBT. At block 244, at least one directional electrical element is provided. As shown in FIGS. 2 and 4 through 11, the at least one directional electrical element may include one or more zener diodes connected in series between the collector C and the gate G of the power semiconductor device. At block 246, a circuit segment associated with the at least one directional electrical element is provided. As shown in FIGS. 4 through 11, the circuit segment in one aspect may be one or more resistors, a capacitor and a directional device, such as, a diode or a BJT. At block 248, the power semiconductor device is switched off to change the collector C to emitter E current of the power semiconductor device. As discussed in connection with FIG. 4, during operation, when the voltage output between the collector C and the emitter E of the power semiconductor device reaches the zener voltage, a current flows to the gate G and turns on the power semiconductor device in order to limit the output voltage of the power semiconductor device.

It should be noted, that the method 240 may be modified in various ways in accordance with certain embodiments of the disclosure. For example, one or more operations of the method 240 may be eliminated or executed out of order in other embodiments of the disclosure. Additionally, other operations may be added to the method 240 in accordance with other embodiments of the disclosure.

While certain embodiments of the disclosure have been described in connection with what is presently considered to be the most practical and various embodiments, it is to be understood that the disclosure is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the disclosure, including the best mode, and also to enable any person skilled in the art to practice certain embodiments of the disclosure, including making and using any devices or systems and performing any incorporated methods. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

The claimed invention is:

1. A system, comprising:
a first circuit portion, the first circuit portion comprising a power semiconductor device and a series combination of a first zener diode and a second zener diode, wherein the power semiconductor device comprises a first node, a second node and a third node, and wherein a proximal end of the series combination of the first zener diode and the second zener diode is directly connected to the first node and a distal end of the series combination of the first zener diode and the second zener diode is directly connected to the second node of the power semiconductor device; and
a second circuit portion comprising a first resistor, a capacitor, and at least one of a diode or a transistor,
wherein the first resistor is connected in parallel with the capacitor to form a sub-circuit, and the sub-circuit is connected to the one of a diode or a transistor, the second circuit portion connected in parallel with the first zener diode of the first circuit portion to clamp a peak voltage between the first node and the third node of the power semiconductor device.

2. The system of claim 1, wherein the second circuit portion further comprises a second resistor connected in parallel with the one of a diode or a transistor.

3. The system of claim 1, wherein the one of a diode or a transistor is a bipolar junction transistor having a base, a collector, and an emitter, and wherein a proximal end of the parallel combination of the first resistor and the capacitor is connected to the base of the bipolar junction transistor and a distal end of the parallel combination of the first resistor and the capacitor is connected to the collector of the bipolar junction transistor.

4. The system of claim 1, wherein the one of a diode or a transistor is a bipolar NPN transistor having a base, a collector, and an emitter, and wherein the capacitor is connected to the base of the bipolar NPN transistor.

5. An apparatus, comprising:
a first circuit portion comprising a power semiconductor device and a series combination of two or more zener diodes connected across a first node and a second node of the power semiconductor device; and a second circuit portion comprising a first resistor, a capacitor, and one of a diode or a transistor, the second circuit portion connected in parallel with one of the two or more zener diodes to clamp a peak voltage output between the first node and a third node of the power semiconductor device.

6. The apparatus of claim 5, wherein the first resistor is in parallel with the capacitor.

7. The apparatus of claim 5, wherein the second circuit portion further comprises a second resistor in parallel with the one of a diode or a transistor.

8. The apparatus of claim 5, wherein the one of a diode or a transistor is a bipolar junction transistor having a base, a collector and an emitter, and wherein each of the capacitor and the first resistor is connected to the base of the bipolar junction transistor.

9. The apparatus of claim 5, wherein the one of a diode or a transistor is a bipolar PNP transistor having a base, a collector and an emitter, and wherein each of the capacitor and the first resistor is connected to the base of the bipolar PNP transistor.

10. The apparatus of claim 6, wherein the one of a diode or a transistor is a bipolar NPN transistor having a base, a collector and an emitter, and wherein each of the capacitor and the first resistor is connected to the base of the bipolar NPN transistor.

11. A method, comprising:
providing a power semiconductor device, wherein the power semiconductor device comprises a first node, a second node and a third node;

providing at least two or more zener diodes between the first node and the second node of the power semiconductor device;

providing a circuit segment comprising one of a diode or a transistor, a resistor, and a capacitor, the circuit segment directly connected in parallel with at least one of the two or more zener diodes; and selectively providing power to the power semiconductor device, the circuit segment operative to clamp a peak voltage output between the first node and the third node of the power semiconductor device.

12. The method of claim 11, wherein the power semiconductor device is an insulated gate bipolar transistor.

13. The method of claim 11, wherein the power semiconductor device is a metal oxide semiconductor field effect transistor (MOSFET).

14. The method of claim 11, wherein the one of a diode or a transistor is a bipolar junction transistor.

* * * * *

UNITED STATES PATENT AND TRADEMARK OFFICE
CERTIFICATE OF CORRECTION

| | | |
|---|---|---|
| PATENT NO. | : 8,780,516 B2 | Page 1 of 1 |
| APPLICATION NO. | : 13/466627 | |
| DATED | : July 15, 2014 | |
| INVENTOR(S) | : R. G. Wagoner et al. | |

It is certified that error appears in the above-identified patent and that said Letters Patent is hereby corrected as shown below:

Title Page/item [73] Assignee, line 1, change "Electric Conpany" to -- Electric Company --

Signed and Sealed this
Ninth Day of December, 2014

Michelle K. Lee
*Deputy Director of the United States Patent and Trademark Office*